(12) United States Patent
Cho et al.

(10) Patent No.: US 11,735,637 B2
(45) Date of Patent: *Aug. 22, 2023

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Eunae Cho, Seoul (KR); Dongjin Lee, Seoul (KR); Ji Eun Lee, Suwon-si (KR); Kyoung-Ho Jung, Suwon-si (KR); Dong Su Ko, Seoul (KR); Yongsu Kim, Seongnam-si (KR); Jiho Yoo, Suwon-si (KR); Sung Heo, Suwon-si (KR); Hyun Park, Suwon-si (KR); Satoru Yamada, Seoul (KR); Moonyoung Jeong, Suwon-si (KR); Sungjin Kim, Suwon-si (KR); Gyeongsu Park, Hwaseong-si (KR); Han Jin Lim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/400,901

(22) Filed: Aug. 12, 2021

(65) Prior Publication Data
US 2021/0376099 A1 Dec. 2, 2021

Related U.S. Application Data

(63) Continuation of application No. 16/432,298, filed on Jun. 5, 2019, now Pat. No. 11,127,828, which is a
(Continued)

(30) Foreign Application Priority Data

Mar. 2, 2015 (KR) .................. 10-2015-0029219

(51) Int. Cl.
*H01L 29/423* (2006.01)
*H01L 29/49* (2006.01)
(Continued)

(52) U.S. Cl.
CPC .... *H01L 29/4236* (2013.01); *H01L 21/28088* (2013.01); *H01L 29/4966* (2013.01); *H01L 29/513* (2013.01); *H01L 29/517* (2013.01)

(58) Field of Classification Search
CPC .......... H01L 29/4236; H01L 21/28088; H01L 29/4966; H01L 29/513; H01L 29/517; H01L 29/495
See application file for complete search history.

(56) References Cited

U.S. PATENT DOCUMENTS 6,544,882 B1 4/2003 Liu et al.
6,563,262 B1 5/2003 Cao
(Continued)

FOREIGN PATENT DOCUMENTS

KR 2001-0017820 A 3/2001
KR 10-0827446 B1 5/2008
(Continued)

OTHER PUBLICATIONS

Communication dated Jan. 28, 202 issued by the Korean Patent Office in application No. 10-2015-0029219.

*Primary Examiner* — Su C Kim
(74) *Attorney, Agent, or Firm* — Sughrue Mion, PLLC

(57) ABSTRACT

A semiconductor device and a method of manufacturing the same are provided. The semiconductor device includes a substrate including a trench. The semiconductor device further includes a gate electrode disposed in the trench, and a gate insulating film disposed between the substrate and the gate electrode. The gate electrode includes a gate conductor and a metal element, and an effective work function of the
(Continued)

gate electrode is less than an effective work function of the gate conductor.

11 Claims, 10 Drawing Sheets

Related U.S. Application Data continuation of application No. 14/854,272, filed on Sep. 15, 2015, now Pat. No. 10,325,992.

(51) Int. Cl.
    *H01L 21/28*     (2006.01)
    *H01L 29/51*     (2006.01)

(56) References Cited

U.S. PATENT DOCUMENTS

| | | | |
|---|---|---|---|
| 7,425,497 B2 | 9/2008 | Chudzik et al. | |
| 7,750,418 B2 | 7/2010 | Chudzik et al. | |
| 7,829,953 B2 | 11/2010 | Jung et al. | |
| 8,298,927 B2 | 10/2012 | Xu et al. | |
| 8,367,558 B2 | 2/2013 | Xu et al. | |
| 8,753,936 B2 | 6/2014 | Chudzik et al. | |
| 9,287,199 B2 | 3/2016 | Lee | |
| 9,564,505 B2 | 2/2017 | Chudzik et al. | |
| 10,325,992 B2 * | 6/2019 | Cho | H01L 29/513 |
| 11,127,828 B2 * | 9/2021 | Cho | H01L 29/4236 |
| 2002/0195683 A1 | 12/2002 | Kim et al. | |
| 2007/0178634 A1 | 8/2007 | Jung et al. | |
| 2009/0242963 A1 | 10/2009 | Shingu et al. | |
| 2010/0240184 A1 | 9/2010 | Jung et al. | |
| 2011/0108924 A1 | 5/2011 | Suzuki | |
| 2011/0272765 A1 | 11/2011 | Seo | |
| 2011/0298060 A1 | 12/2011 | Chen | |
| 2012/0100684 A1 | 4/2012 | Min et al. | |
| 2012/0129327 A1 | 5/2012 | Lee | |
| 2012/0261773 A1 | 10/2012 | Ogawa | |
| 2012/0280372 A1 | 11/2012 | Umezawa et al. | |
| 2013/0023098 A1 | 1/2013 | Huang et al. | |
| 2013/0313648 A1 | 11/2013 | Chiang et al. | |
| 2014/0048865 A1 | 2/2014 | Toh et al. | |
| 2014/0063934 A1 * | 3/2014 | Oh | H01L 21/28035 365/182 |
| 2014/0138753 A1 | 5/2014 | Ramaswamy et al. | |
| 2014/0239405 A1 | 8/2014 | Ha et al. | |
| 2014/0363962 A1 * | 12/2014 | Hou | H01L 29/513 438/591 |
| 2014/0367774 A1 * | 12/2014 | Yoo | H01L 29/4236 257/330 |

FOREIGN PATENT DOCUMENTS

| | | |
|---|---|---|
| KR | 10-2008-0094894 A | 10/2008 |
| KR | 1020110050599 A | 5/2011 |
| KR | 1020120055430 A | 5/2012 |
| KR | 10-2013-0022336 A | 3/2013 |
| KR | 10-2014-0106039 A | 9/2014 |

* cited by examiner

SEMICONDUCTOR DEVICE AND METHOD OF MANUFACTURING THE SAME

CROSS-REFERENCE TO RELATED APPLICATION

This is a continuation application of U.S. patent application Ser. No. 16/432,298, filed Jun. 5, 2019 in the U.S. Patent and Trademark Office, which is a continuation application of U.S. patent application Ser. No. 14/854,272, filed Sep. 15, 2015, in the U.S. Patent and Trademark Office, which claims priority from Korean Patent Application No. 10-2015-0029219, filed on Mar. 2, 2015, in the Korean Intellectual Property Office, the disclosure of which is incorporated herein by reference in its entirety.

BACKGROUND

1. Field

Apparatuses and methods consistent with exemplary embodiments relate to a semiconductor device and a method of manufacturing the same.

2. Description of the Related Art

As a unit cell area is decreased according to high integration of a semiconductor device, electrical reliability may need to be ensured. For example, as the unit cell area becomes smaller, the possibility of transporting electrons from one cell channel to an adjacent cell channel may be higher, which may cause malfunctions of a transistor such as data loss.

SUMMARY

Exemplary embodiments address at least the above disadvantages and other disadvantages not described above. Also, the exemplary embodiments are not required to overcome the disadvantages described above, and may not overcome any of the problems described above.

Exemplary embodiments provide a semiconductor device being capable of ensuring electrical reliability. Exemplary embodiments further provide a method of manufacturing the semiconductor device.

According to an aspect of an exemplary embodiment, there is provided a semiconductor device a semiconductor device including a substrate including a trench. The semiconductor device further includes a gate electrode disposed in the trench, and a gate insulating film disposed between the substrate and the gate electrode. The gate electrode includes a gate conductor and a metal element, and an effective work function of the gate electrode is less than an effective work function of the gate conductor.

The gate electrode may be a continuous thin film having a substantially uniform thickness in the trench along an interior wall of the substrate.

The gate electrode may have a thickness in a range from about 1 nm to about 30 nm.

The gate conductor may be one among titanium, titanium nitride, and titanium oxynitride, and a work function and an electronegativity of the metal element may be less than a work function and an electronegativity of the gate conductor.

The metal element may be at least one among lanthanum, strontium, yttrium, lithium, manganese, and silicon.

The gate conductor may be titanium nitride, and the metal element may be lanthanum.

An amount of the metal element may be in a range from about 0.01 at % to about 10 at % based on a total atom number of the gate conductor and the metal element.

The effective work function of the gate electrode may be less than the effective work function of the gate conductor by about 0.10 eV to about 1.40 eV.

The gate insulating film may be a silicon oxide film.

The semiconductor device may further include a metal that fills the trench.

The metal element may be diffused into the gate conductor.

According to an aspect of another exemplary embodiment, there is provided a method of manufacturing a semiconductor device, the method including providing a substrate including a trench. The method further includes forming a gate insulating film in the trench, and forming a metal oxide film on the gate insulating film, the metal oxide film including a metal element. The method further includes forming a gate conductive layer on the metal oxide film, and heating to diffuse the metal element into the gate conductive layer.

Each of the forming the gate insulating film, the forming the metal oxide film, and the forming the gate conductive layer may include forming a continuous thin film having a substantially uniform thickness in the trench along an interior wall of the substrate.

The forming the gate conductive layer may include depositing on the metal oxide film one among titanium, titanium nitride, and titanium oxynitride, and the forming the metal oxide film may include depositing on the gate insulating film at least one among a lanthanum oxide, a strontium oxide, a yttrium oxide, a lithium oxide, a manganese oxide, and a silicon oxide.

The metal oxide film may have a thickness in a range from about 0.1 nm to about 3 nm.

The forming the gate insulating film may include depositing in the trench a silicon oxide, or thermal-oxidizing the substrate to form a silicon oxide.

The heating may be performed in a range from about 600° C. to about 1200° C. for about 10 minutes to about 20 hours.

The method may further include filling the trench with a metal.

According to an aspect of another exemplary embodiment, there is provided a semiconductor device including a substrate including a trench. The semiconductor device further includes a gate insulating film disposed in the trench, and a gate electrode disposed on the gate insulating film, the gate electrode including a gate conductor and a metal element, and a work function of the metal element being less than a work function of the gate conductor.

The gate conductor may be one among titanium, titanium nitride, and titanium oxynitride, and the metal element may be at least one among lanthanum, strontium, yttrium, lithium, manganese, and silicon.

BRIEF DESCRIPTION OF THE DRAWINGS

The above and/or other aspects will be more apparent by describing in detail exemplary embodiments with reference to the accompanying drawings, in which.

DETAILED DESCRIPTION OF THE EXEMPLARY EMBODIMENTS

Figure 1:
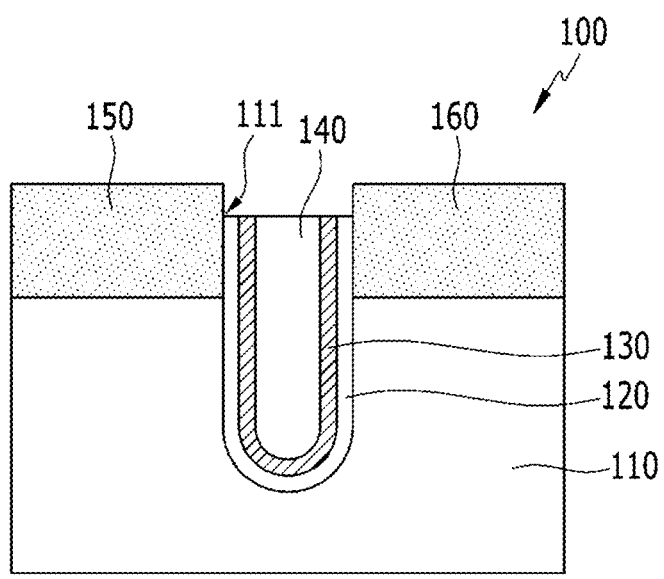
FIG. 1 is a cross-sectional view of a semiconductor device according to an exemplary embodiment.

Exemplary embodiments are described in more detail with reference to the accompanying drawings.

In the following description, like reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail because they would obscure the description with unnecessary detail.

In the drawings, thicknesses of layers, films, panels, regions, etc., are exaggerated for clarity. It will be understood that when an element such as a layer, film, region, or substrate is referred to as being "on" another element, it can be directly on the other element, or intervening elements may also be present. In contrast, when an element is referred to as being "directly on" another element, there are no intervening elements present.

Hereinafter, 'metal' refers to a metal and/or a semi-metal.

FIG. 1 is a cross-sectional view of a semiconductor device 100 according to an exemplary embodiment.

Referring to FIG. 1, the semiconductor device 100 includes a substrate 110, a gate insulating film 120, a gate electrode 130, a filling conductor 140, a source electrode 150, and a drain electrode 160.

The substrate 110 may be a semiconductor substrate. For example, the substrate 110 may be a silicon substrate, a germanium substrate, a silicon-germanium substrate, a gallium-arsenic substrate, an SOI (silicon-on-insulator) substrate, or a GOI (germanium-on-insulator) substrate. However, the substrate 110 is not limited thereto, and may be a glass substrate, a ceramic substrate, or a polymer substrate.

The substrate 110 may include a plurality of trenches including a trench 111. The trench 111 is disposed to a predetermined or given depth from a surface of substrate 110 to expose an interior wall of the substrate 110. The shape of the trench 111 is not limited, and for example, a connecting part of a bottom surface and a side surface of the trench 111 may have a rounded shape, and the side surface of trench 111 may be inclined at a predetermined angle.

The gate insulating film 120 is disposed in the trench 111 along the interior wall of the substrate 110. The gate insulating film 120 may be a thin film, and for example, may be a continuous thin film having a substantially uniform thickness in the trench 111 along the interior wall of the substrate 110. The gate insulating film 120 may have a thickness of, for example, about 1 nm to about 30 nm, about 3 nm to about 20 nm, or about 5 nm to about 10 nm.

The gate insulating film 120 may be, for example, an oxide film, and may include, for example, a silicon oxide and/or a metal oxide. The metal oxide may include, for example, a hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, and/or a lead scandium tantalum oxide, but is not limited thereto. For example, the gate insulating film 120 may be a silicon oxide film.

The gate electrode 130 is disposed on the gate insulating film 120 in the trench 111 along the interior wall of the substrate 110. The gate electrode 130 may also be a thin film, and may be, for example, a continuous thin film having a substantially uniform thickness in the trench 111 along the interior wall of substrate 110. The gate electrode 130 may have a thickness of, for example, about 1 nm to about 30 nm, about 3 nm to about 20 nm, or about 3 nm to about 10 nm.

The gate electrode 130 includes a gate conductor and a metal element distributed in the gate conductor. The gate conductor may be, for example, a titanium-containing conductor, for example, titanium (Ti), titanium nitride (TiN), and/or titanium oxynitride (TiON). For example, the gate conductor may be TiN.

The metal element may be selected from metals having a smaller work function and a smaller electronegativity than those of the gate conductor. The metal element may have a work function of less than or equal to about 4.20 eV, for example, a work function of about 2.00 eV to about 4.20 eV. The metal element may include, for example, lanthanum (La), strontium (Sr), yttrium (Y), lithium (Li), manganese (Mn), silicon (Si), or a combination thereof, but is not limited thereto. An amount of the metal element may be about 0.01 at % to about 10 at % based on a total atom number of the gate conductor and the metal element.

The gate conductor is chemically bonded with the metal element, for example, Ti of the gate conductor may be chemically bonded with the metal element of X to provide a Ti—X chemical bond. In another example, the gate conductor of TiN may be chemically bonded with the metal element of X to provide a chemical bond of Ti—X—N or Ti—N—X. In still another example, when the gate conductor is TiN, and the metal element is La, a chemical bond of Ti—La—N or Ti—N—La may be provided.

In this way, as the metal element is distributed in the gate conductor to change the chemical bond of the gate conductor, a work function of the gate electrode 130 may be different from a work function of the gate conductor. Herein, the work function of the gate electrode 130 is an effective work function, which means a changed work function by influences of a junction interface between the electrode and the oxide film in a structure in which the electrode is in contact with the oxide film. The effective work function is a main factor determining operation characteristics of the semiconductor device 100.

The effective work function of the gate electrode 130 may be smaller than the effective work function of the gate conductor. For example, the effective work function of the gate electrode 130 may smaller by about 0.10 eV to about 1.40 eV, for example, by about 0.20 eV to about 1.00 eV, than the effective work function of the gate conductor.

In this way, a barrier to transporting electrons toward an adjacent channel of the semiconductor device 100 may be raised by lowering the effective work function of the gate electrode 130. Thus, the electrons moving from one channel to the adjacent channel may be reduced and/or blocked to enhance device reliability.

The trench 111 is filled with the filling conductor 140. The filling conductor 140 is in contact with a gate electrode 130, and fills the trench 111. The filling conductor 140 may be, for example, tungsten or a tungsten alloy, but is not limited thereto.

The source electrode 150 and the drain electrode 160 are disposed on both sides of trench 111, and may be, for example, conductive regions doped with an impurity. The source electrode 150 and the drain electrode 160 may have higher conductivity than the substrate 110, For example, when the semiconductor device 100 is an N-type transistor, the source electrode 150 and the drain electrode 160 may be doped with an n-type impurity in a high concentration. In another example, when the semiconductor device 100 is a P-type transistor, the source electrode 150 and the drain electrode 160 may be doped with a p-type impurity in a high concentration. Each of the n-type impurity and the p-type impurity may be included in a concentration of, for example, greater than or equal to about $10^{15}/cm^3$, but is not limited thereto.

According to an exemplary embodiment, for a semiconductor device including a substrate including the silicon substrate, a gate insulating film including a silicon oxide, and a gate electrode including TiN and La, an effective work function change may be measured depending upon a content of La. The effective work function may be obtained by using first-principles electronic structure calculations.

Figure 5:
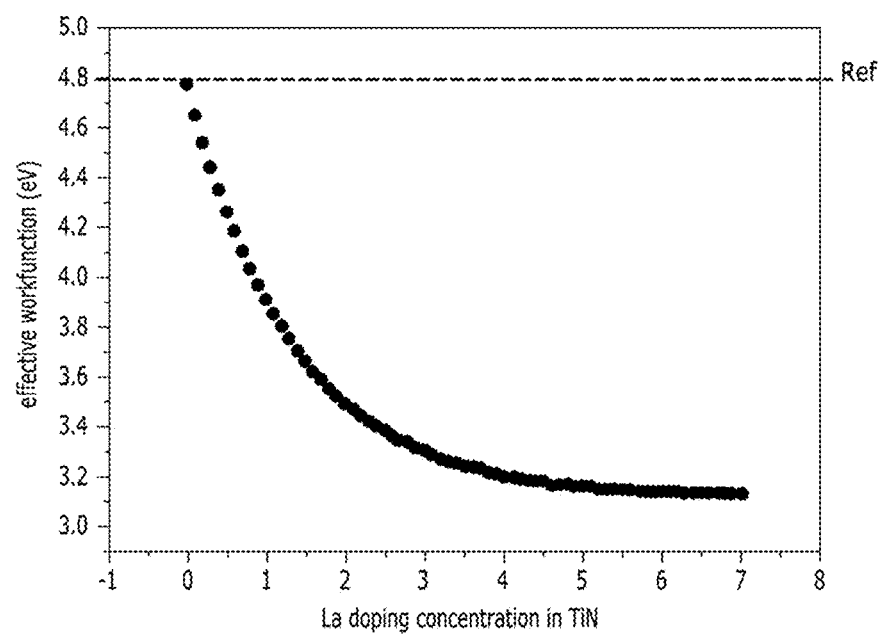
FIG. 5 is a graph showing a change of an effective work function depending upon a content of lanthanum (La) in a semiconductor device according to an exemplary embodiment.

FIG. 5 is a graph showing an effective work function change depending upon a content of La in a semiconductor device according to an exemplary embodiment.

Referring to FIG. 5, it may be confirmed that a TiN electrode including La has a lower effective work function compared to a TiN electrode having no content of La. Specifically, a reference (Ref) effective work function of the TiN electrode is about 4.8 eV; on the other hand, a higher doping concentration of La in the TiN electrode provides the lower effective work function. It may be confirmed that the effective work function ranges from about 3.1 eV to about 4.7 eV when including La within about 7 at %.

Figure 2:
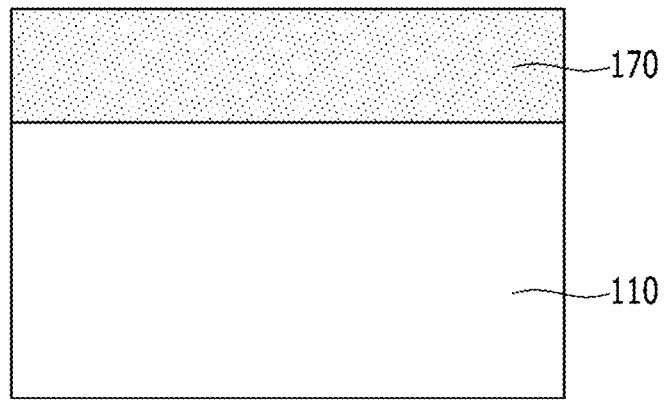
FIGS. 2 to 4 are cross-sectional views sequentially showing a method of manufacturing a semiconductor device according to an exemplary embodiment.
Figure 3:
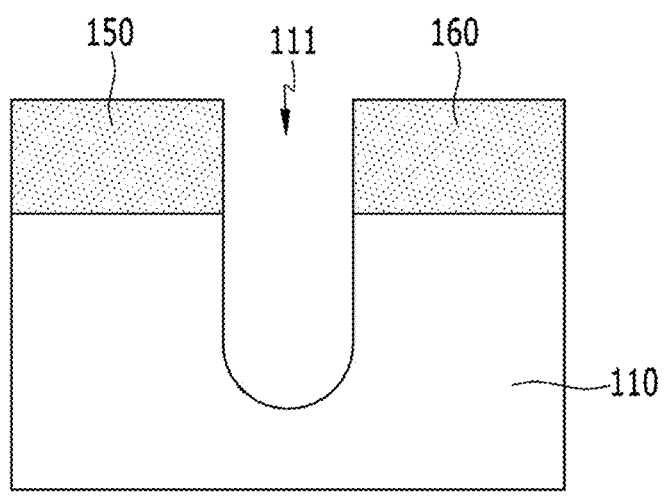
Figure 4:
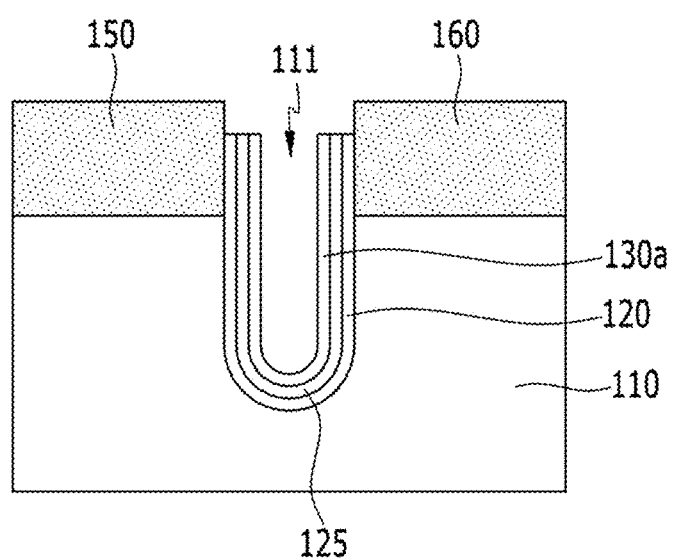

FIGS. 2 to 4 are cross-sectional views sequentially showing a method of manufacturing a semiconductor device according to an exemplary embodiment.

Referring to FIG. 2, an n-type or p-type impurity is injected into an upper surface of the substrate 110 at a high concentration to form a conductive layer 170.

Subsequently, an isolation layer (not shown) may be formed. The isolation layer may be formed using a silicon oxide according to a shallow trench isolation (STI) process, but is not limited thereto.

Referring to FIG. 3, the trench 111 is formed in the substrate 110. The trench 111 may be obtained by, for example, an etching process using an etching mask and a photosensitive pattern. The etching mask may be, for example, an oxide, a nitride, or an oxynitride, but is not limited thereto. In detail, a silicon nitride may be stacked on the conductive layer 170 by chemical vapor deposition (CVD) and patterned using the photosensitive pattern to form the etching mask, and the substrate 110 may be etched using the etching mask to form the trench 111. The conductive layer 170 is divided by the trench 111 to form the source electrode 150 and the drain electrode 160.

Referring to FIG. 4, the gate insulating film 120, a metal oxide film 125, and a gate conductive layer 130a are sequentially formed in the trench 111. The gate insulating film 120, the metal oxide film 125, and the gate conductive layer 130a may be formed by, for example, CVD or atomic layer deposition, and may be formed as a continuous film in the trench 111 along the interior wall of the substrate 110.

The gate insulating film 120 may be, for example, formed of a silicon oxide and/or a metal oxide, and may be, for example, formed by depositing a hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, and/or a lead scandium tantalum oxide. For example, the gate insulating film 120 may be formed by depositing a silicon oxide. In addition, the interior wall of the substrate 110 in the trench 111 may be thermal-oxidized to form the gate insulating film 120 including a silicon oxide.

The metal oxide film 125 may be an oxide film including the metal element, and may be formed by depositing, for example, a lanthanum oxide, a strontium oxide, a yttrium oxide, a lithium oxide, a manganese oxide, a silicon oxide, or a combination thereof. The metal oxide film 125 may be formed in, for example, a thickness of about 0.1 nm to about 3 nm, about 0.2 nm to about 2 nm, or about 0.3 nm to 1.3 nm.

The gate conductive layer 130a may be formed by depositing a gate conductor, for example, a titanium-containing conductor, for example Ti, TiN, and/or TiON. For example, the gate conductor may be TiN.

The forming the gate insulating film 120, the forming the metal oxide film 125, and the forming the gate conductive layer 130a may each form a continuous thin film having a substantially uniform thickness in the trench 111 along the interior wall of the substrate 110.

Subsequently, the substrate 110 is heat treated. The heat treatment is performed at a temperature that is sufficient to diffuse the metal element of the metal oxide film 125 into the gate conductive layer 130a. The heat treatment may be performed, for example, at about 600° C. to about 1200° C. for about 10 minutes to about 20 hours, at about 600° C. to about 1000° C. for about 10 minutes to about 15 hours, or at about 600° C. to about 800° C. for about 20 minutes to about 10 hours, but is not limited thereto.

The metal element of the metal oxide film 125 is diffused into the gate conductive layer 130a by the heat treatment, to form gate electrode 130 of FIG. 1 in which the metal element is distributed in the gate conductor.

Subsequently, the trench 111 is filled with the filling conductor 140 as shown in FIG. 1.

According to an exemplary embodiment, whether a metal atom is diffused, an effective work function change and an electric characteristic change are measured when a structure in which a gate insulating film, a lanthanum oxide (LaO) film (having a thickness at about 4.5 Å or about 7 Å), and a TiN gate conductive layer are sequentially stacked and heat treated at about 700° C. for about 2 minutes.

Figure 6:
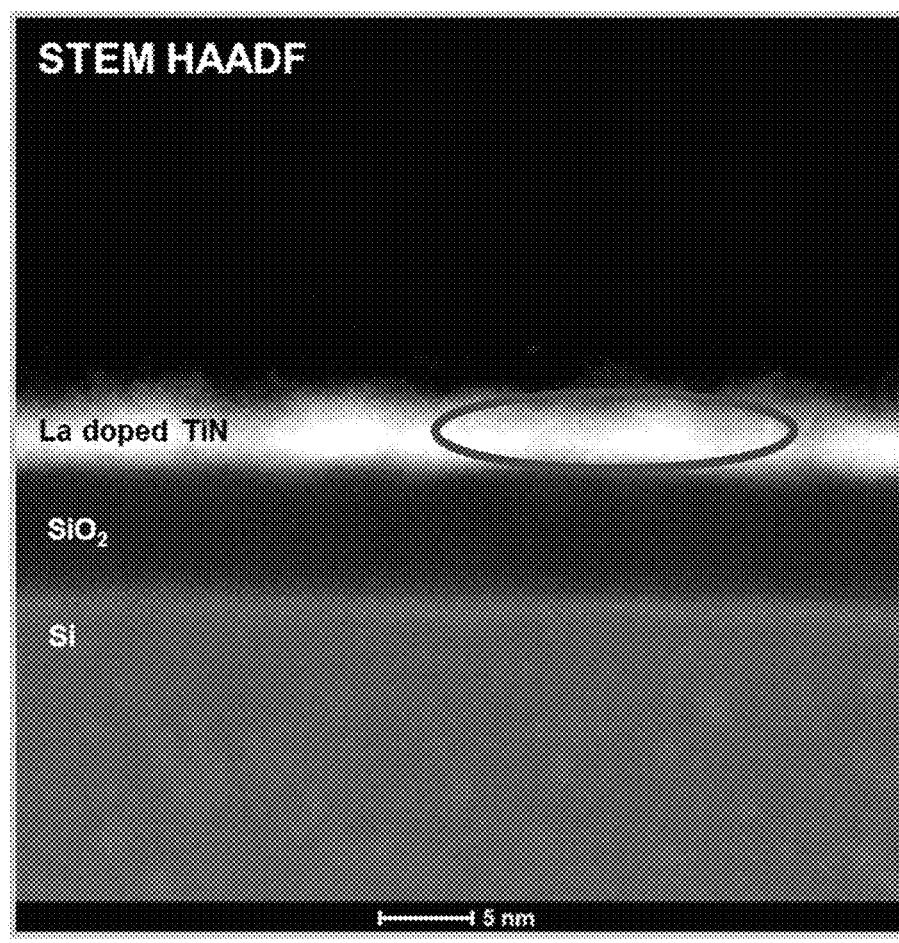
FIG. 6 is a scanning electron microscope (SEM) image showing a stacked structure in a trench of a semiconductor device according to an exemplary embodiment.
Figure 7:
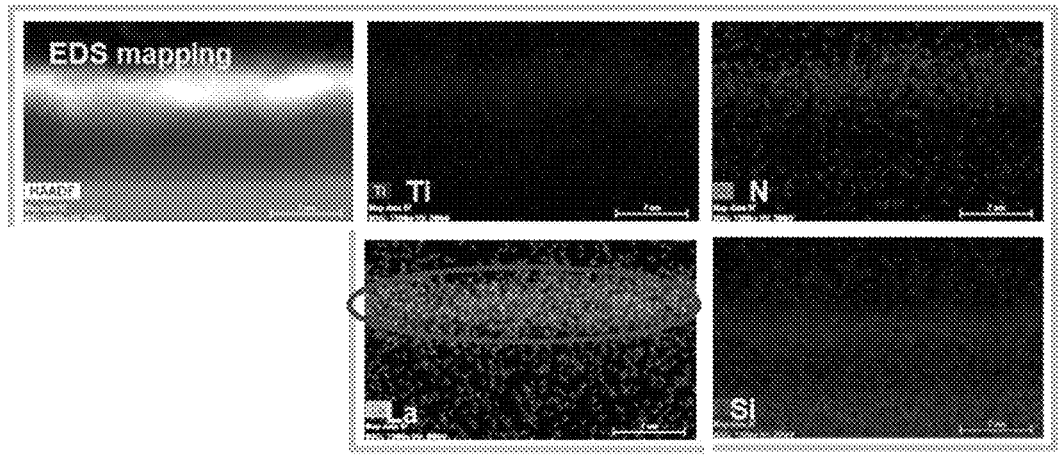
FIG. 7 is an energy dispersive spectroscopy (EDS) image showing an atomic distribution of a gate electrode in the stacked structure shown in FIG. 6.
Figure 8:
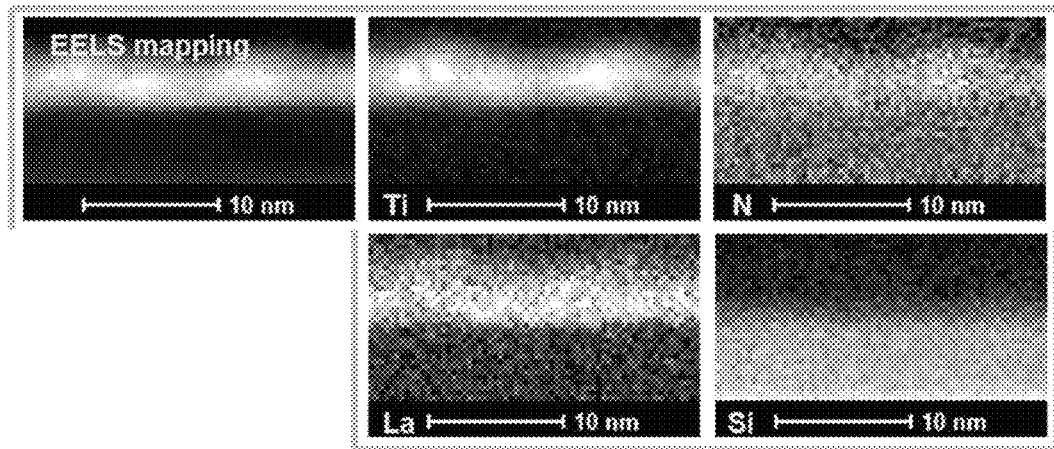
FIG. 8 is an electron energy loss spectroscopy (EELS) image showing an atomic distribution of the gate electrode in the stacked structure shown in FIG. 6.

FIG. 6 is a scanning electron microscope (SEM) image showing a stacked structure in a trench of a semiconductor device according to an exemplary embodiment. FIG. 7 is an energy dispersive spectroscopy (EDS) image showing atomic distribution of a gate electrode in the stacked structure shown in FIG. 6. FIG. 8 is an electron energy loss spectroscopy (EELS) image showing an atomic distribution of the gate electrode in the stacked structure shown in FIG. 6.

Referring to FIG. 6 to FIG. 8, it may be confirmed that La is distributed in a TiN gate after heat treatment at a high temperature. Therefrom, it may be confirmed that La of a LaO film is diffused into the TiN gate by the heat treatment at the high temperature.

Figure 9:
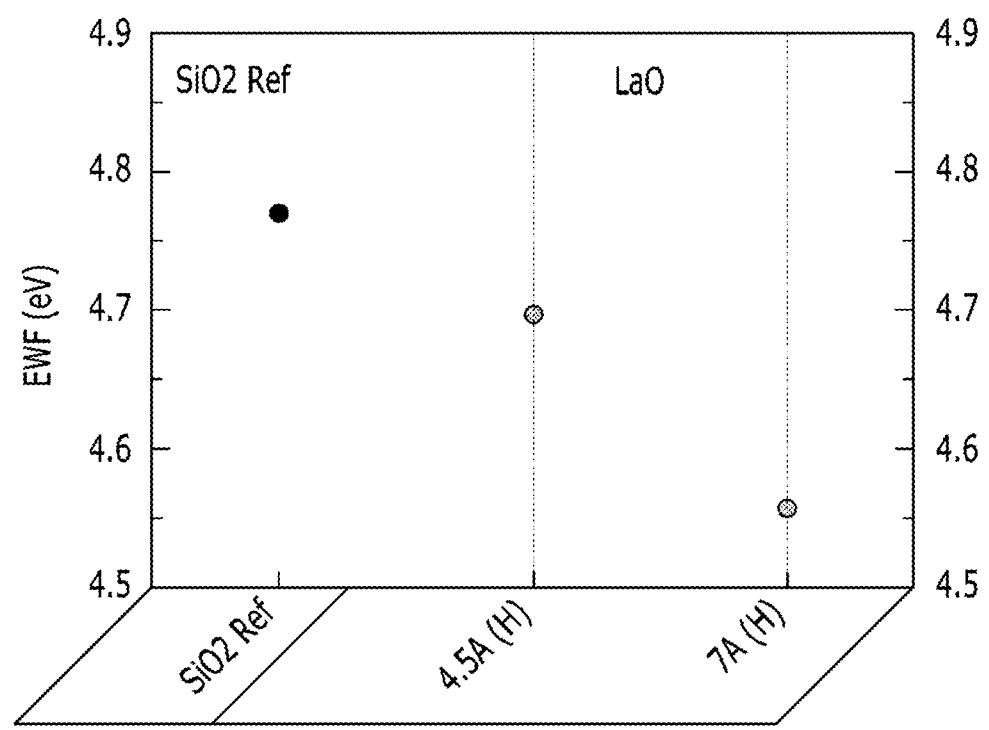
FIG. 9 is a graph showing a change of an effective work function of a semiconductor device according to an exemplary embodiment.

FIG. 9 is a graph showing an effective work function change of a semiconductor device according to an exemplary embodiment.

Referring to FIG. 9, it may be understood that an effective work function (EWF) is lowered when a LaO film has a thickness of about 4.5 Å and about 7 Å and is heat treated, and the effective work function may be further lowered when the LaO film has a thicker thickness.

Figure 10:
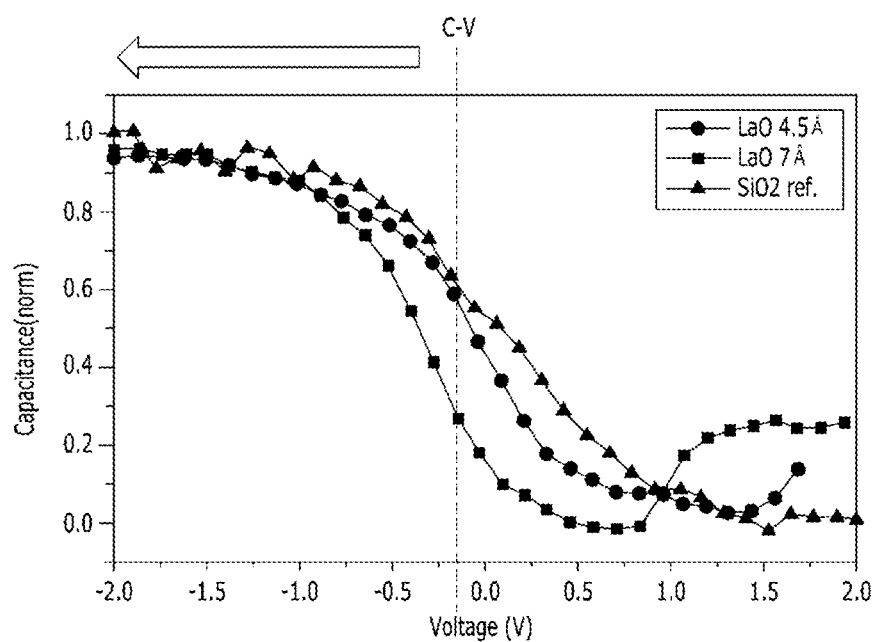
FIG. 10 is a graph showing characteristics of capacitance and voltage of a semiconductor device according to an exemplary embodiment.

FIG. 10 is a graph showing capacitance and voltage characteristics of a semiconductor device according to an exemplary embodiment.

Referring to FIG. 10, it may be understood that a flat band voltage ($V_{FB}$) is moved in a negative (−) direction when applied with a LaO film having a thickness of about 4.5 Å and about 7 Å and being heat treated. Thus, it may be presumed that an effective work function may be lowered.

The foregoing exemplary embodiments and advantages are merely exemplary embodiments and are not to be construed as limiting the exemplary embodiments. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A semiconductor device comprising:
    a substrate comprising a trench;
    a gate insulating film, the gate insulating film being a thin film disposed in the trench along an interior wall of the substrate; and
    a gate electrode, the gate electrode being a thin film isolated in the trench along the interior wall of the substrate;
    wherein the gate electrode and the gate insulating film contact to each other in the trench,
    wherein the gate electrode comprises a gate conductor and a metal element that is intermingled with the gate conductor,
    wherein the metal element comprises lanthanum (La), strontium (Sr), silicon (Si), yttrium (Y), lithium (Li), manganese (Mn), or a combination thereof,
    wherein the gate insulating film has a uniform thickness along the interior wall of the substrate, and
    wherein a thickness of the gate insulating film is about 1 nm to about 30 nm.

2. The semiconductor device of claim 1, wherein the gate conductor comprises a titanium-containing conductor.

3. The semiconductor device of claim 2, wherein the gate conductor comprises titanium, titanium nitride, titanium oxynitride, or a combination thereof.

4. The semiconductor device of claim 1, wherein the gate conductor is chemically bonded with the metal element.

5. The semiconductor device of claim 1, wherein an amount of the metal element is in a range from about 0.01 at % to about 10 at % based on a total atom number of the gate conductor and the metal element.

6. The semiconductor device of claim 1, wherein the gate electrode has a uniform thickness along the interior wall of the substrate.

7. The semiconductor device of claim 6, wherein a thickness of the gate electrode is about 1 nm to 30 nm.

8. The semiconductor device of claim 1, wherein the gate insulating film comprises silicon oxide, metal oxide, or a combination thereof.

9. The semiconductor device of claim 1, further comprising a filling metal on the gate electrode in the trench, the filling metal being different from the gate conductor and the metal element.

10. The semiconductor device of claim 9, wherein the filling metal is tungsten or tungsten alloy.

11. The semiconductor device of claim 1, further comprising a source electrode and a drain electrode disposed on both sides of the trench, the source electrode and the drain electrode are doped with an n-type impurity or a p-type impurity.

* * * * *